United States Patent [19]
Beall

[11] Patent Number: 5,912,599
[45] Date of Patent: Jun. 15, 1999

[54] BANDWIDTH COMPENSATED BRIDGED-TEE ATTENUATOR

[75] Inventor: Wendell G. Beall, Torrance, Calif.

[73] Assignee: TRW Inc., Redondo Beach, Calif.

[21] Appl. No.: 08/955,085

[22] Filed: Oct. 21, 1997

[51] Int. Cl.[6] .................................................. H03H 7/25
[52] U.S. Cl. ........................................ 333/81 R; 327/308
[58] Field of Search .............................. 333/81 R, 81 A;
327/308

[56] References Cited

U.S. PATENT DOCUMENTS

| 5,281,928 | 1/1994 | Ravid et al. | 333/81 R |
| 5,448,207 | 9/1995 | Kohama | 333/81 R |
| 5,666,089 | 9/1997 | Ehlers | 333/81 R |

Primary Examiner—Paul Gensler
Attorney, Agent, or Firm—Michael S. Yatsko

[57] ABSTRACT

A bandwidth compensated switched bridged-tee attenuator having an attenuation state and a reference state. In order to cause the overall bit attenuation $\Delta A$ to be frequency independent over a relatively wide range of frequencies, one or more additional switches are provided to cause the attenuation state to essentially track the frequency dependence of the reference state. Since the overall attenuation $\Delta A$ is the difference between the attenuation in the attenuation state and the attenuation in the reference state, the overall attenuation $\Delta A$, is virtually frequency independent over a relatively wide range of frequencies.

20 Claims, 8 Drawing Sheets

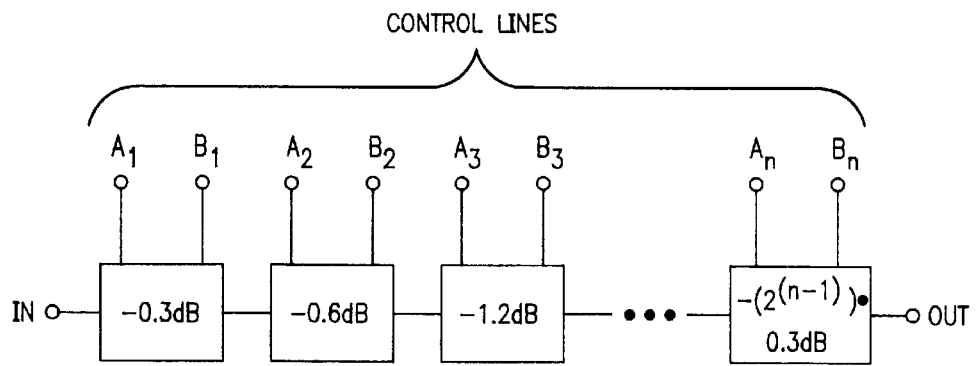
FIG. 1A
PRIOR ART
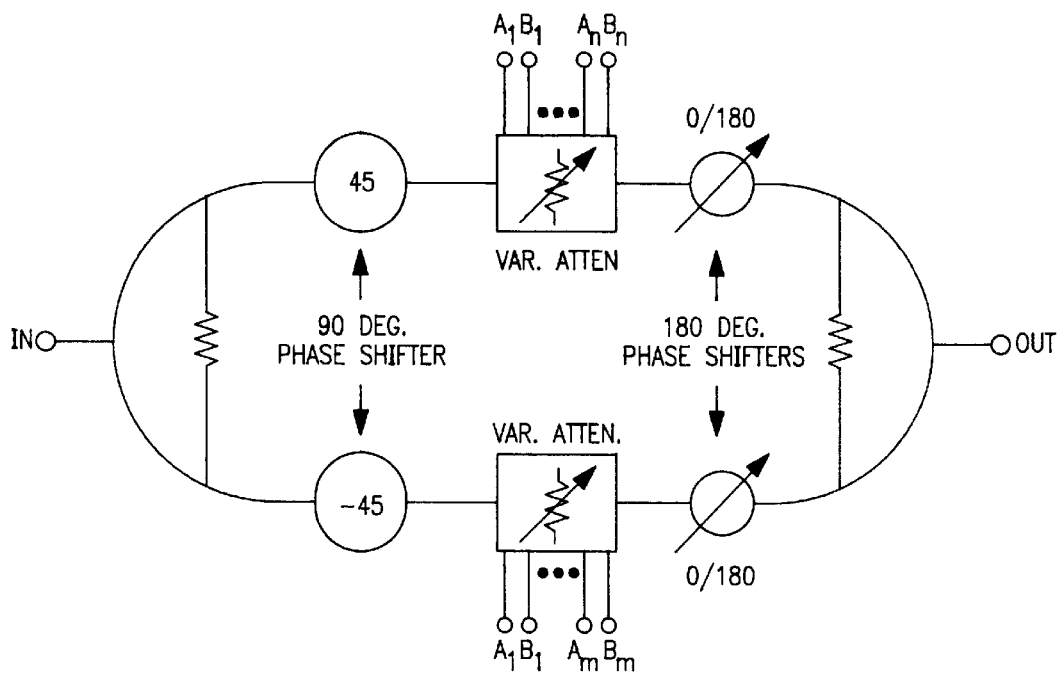
FIG. 1B
PRIOR ART
|                   | A   | B   |
|-------------------|-----|-----|
| ATTENUATION STATE | OFF | ON  |
| REFERENCE STATE   | ON  | OFF |
FIG. 1C

ATTENUATION STATE

REFERENCE STATE

ATTENUATION STATE

REFERENCE STATE

FOR: $\Delta A = -0.3 dB$
$R_1 = 5.17\Omega$    $R_{2att} = 464.4\Omega$
$R_{2th}$ 739.1$\Omega$    $Z_0 = 50\Omega$ $S_1: 120\mu m$    $S_2, S_3: 60\mu m$ $\Delta A(dB) = A_{att}(dB) - A_{ref}(dB)$ □ −0.3dB    −0.6dB    ◇ −1.2dB    × −2.4dB

BANDWIDTH COMPENSATED BRIDGED-TEE ATTENUATOR

BACKGROUND OF THE INVENTION

1. Field of the Invention

The present invention relates generally to an attenuator circuit and more particularly to a bridged-tee bandwidth compensated attenuator circuit having a reference state and an attenuation state which includes switches, for example, field effect transistors (FETs), that are configured so as to provide frequency response tracking in both states resulting in the overall bit attenuation $\Delta A$ being relatively frequency invariant over a relatively broad range of frequencies.

2. Description of the Prior Art

Many monolithic microwave integrated circuit (MMIC) applications are known in which relatively fine levels of switched attenuation are required over relatively wide bandwidths. Binary weighted attenuators connected in cascade, for example, as illustrated in FIG. 1A, provide $2^N$ levels of attenuation for signal amplitude control. When such binary weighted attenuators are used in conjunction with phase shifters and signal splitters, such circuits can be used for variable amplitude and phase (VAP) shift networks as generally shown in FIG. 1B. For such binary weighted attenuators, the finer the level of attenuation for the smallest bit, the greater the number of binary weighted attenuator bits that can be cascaded, resulting in a higher number of attenuation levels $2^N$, wherein N is the number of binary weighted bits in the circuit.

Such attenuator bits are known to have an attenuation state and a reference or "thru" state. The state of the binary weighted attenuator bit is controlled by the control lines $A_n$, $B_n$ for each binary weighted attenuator bit. The logic states for the control lines for each of the attenuators, $A_n$ and $B_n$, are illustrated in FIG. 1C. With such switched attenuator bits, it is not only important to accurately control the attenuation, but also to minimize the phase variation between the attenuation and reference states over a relatively wide bandwidth. However, with known switched binary weighted attenuator circuits, it is relatively difficult at microwave frequencies to make the overall bit attenuation $\Delta A$ and phase variation frequency invariant primarily due to the parasitic off state capacitance of the FET switches used in such circuits. For example, referring to FIG. 2A, a bridged-tee switched attenuator bit circuit is shown. The attenuator includes a first FET, $S_1$, whose gate is controlled by a control line A. The circuit also includes a second FET, $S_2$, whose gate is coupled to a control line B. The equivalent circuits in the attenuation state and reference state are shown in FIGS. 2B and 2C respectively. As shown by the truth table in FIG. 1C, in an attenuation state, the control line A and hence, the switch $S_1$ is off while the control line B is on causing the switch $S_2$ to be on. The equivalent circuit for such a state is illustrated in FIG. 2B. As shown in FIG. 2B, the circuit response is frequency independent and consists of the resistor $R_{2a}$ in parallel with the series combination of the resistor $R_{2b}$ plus the drain to source "on" resistance $R_{DS(S2)}$ of the switch $S_2$. However, as shown in FIG. 2C, in the reference state, the equivalent circuit is frequency dependent due to the off state capacitance of the switch $S_2$. In the reference state, the logic state of the control line A is on, while the logic state of the control line B is off. Thus, as shown, in FIG. 2C, a resistance $R_1$ is in parallel with the drain to source "on" resistance $R_{DS(S1)}$ of the switch $S_1$. However, the off state capacitance $C_{S2}$ of switch $S_2$ forces the circuit to be frequency dependent in this state thereby forcing the overall attenuation, $\Delta A$, to be frequency dependent.

The overall attenuation, $\Delta A$, is the difference in attenuation between the attenuation state, $A_{att}$, and the reference state, $A_{ref}$ as generally given the equation; $\Delta A$ (dB)=$A_{att}$ (dB)–$A_{ref}$(dB). Since the attenuation in the reference state $A_{ref}$ includes the off state capacitance of the switch $S_2$, the overall attenuation $\Delta A$ is frequency dependent, as generally shown in FIG. 2D, which illustrates the attenuation as a function of frequency, for a –0.3 dB attenuator example. The curve 20 represents the attenuation in the attenuation state $A_{att}$, while the curve 22 represents the attenuation in the reference state $A_{ref}$. As shown, the attenuation in the reference state $A_{ref}$, varies as a function of frequency. Since the overall attenuation $\Delta A$, as represented by the curve 24, is merely the difference between the curves 20 and 22, $\Delta A$ varies as a function of frequency as well. Although, in most microwave designs using FET switches, the off state capacitance is generally quite small, it is, however, coupled in series with a relatively large resistance $R_{2b}$ (i.e. $R_{2b}$=1.3 k for $\Delta A$=0.3 db). Thus, as frequency increases, the desired resistance $R_{2a}$ is shunted by an impedance which may be comparable in value at higher frequencies resulting in an increase in reference state attenuation. In the attenuation state, the switch $S_2$ is "on" and presents no problems other than a relatively small and generally negligible "on" resistance, thus resulting in broad band performance for this state. Unfortunately, the difference between the two states, the overall attenuation $\Delta A$, will follow the frequency dependence of the reference state as illustrated by the curve 24 in FIG. 2D.

Further complicating matters, as illustrated in FIG. 2E, the attenuation errors are larger for smaller bit attenuation levels. This is because the smaller attenuation bits have larger resistance $R_{2b}$, causing the bandwidth limiting effect to occur at lower frequencies.

SUMMARY

It is an object of the present invention to provide a bridged-tee attenuation circuit which solves various problems in the prior art.

Primarily it is the object of the present invention to provide a bridged-tee attenuator circuit that provides an overall attenuation, $\Delta A$, which is relatively frequency independent over a relatively wide range of frequencies.

Briefly, the present invention relates to a bandwidth compensated switched bridged-tee attenuator circuit having an attenuation state and a reference state. In order to cause the overall bit attenuation $\Delta A$ to be relatively frequency independent over a relatively wide range of frequencies, the circuit is configured to cause the attenuation state to essentially track the frequency dependence of the reference state. Since the overall attenuation $\Delta A$ is the difference between the attenuation in the attenuation state and the attenuation in the reference state, the overall attenuation $\Delta A$, will be virtually frequency independent over a relatively wide range of frequencies.

BRIEF DESCRIPTION OF THE DRAWINGS

These and other objects and advantages of the present invention will become readily apparent upon consideration of the following detailed description and attached drawing, wherein:

FIG. 1A is a block diagram of a typical switched binary weighted attenuator circuit.

FIG. 1B is a block diagram of a typical variable amplitude and phase (VAP) network utilizing two switched attenuator networks.

FIG. 1C is a logic state truth table illustrating the logic states of the control lines in both the attenuation state and reference state for the typical attenuator circuits illustrated in FIGS. 1A and 1B as well as the attenuator circuits in accordance with FIG. 2 and the present invention.

DETAILED DESCRIPTION

Figure 3A:
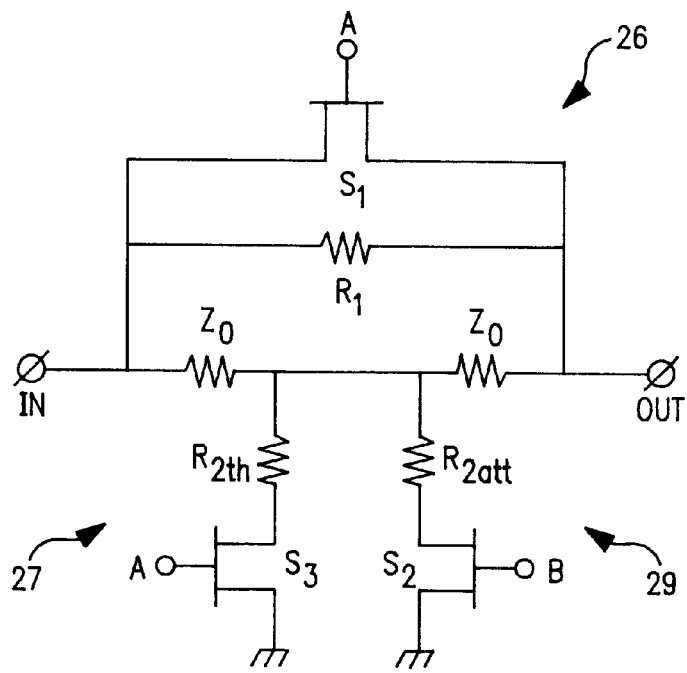
FIG. 3A is a schematic diagram of the bandwidth compensated switch bridged-tee attenuator circuit in accordance with the present invention.
Figure 4A:
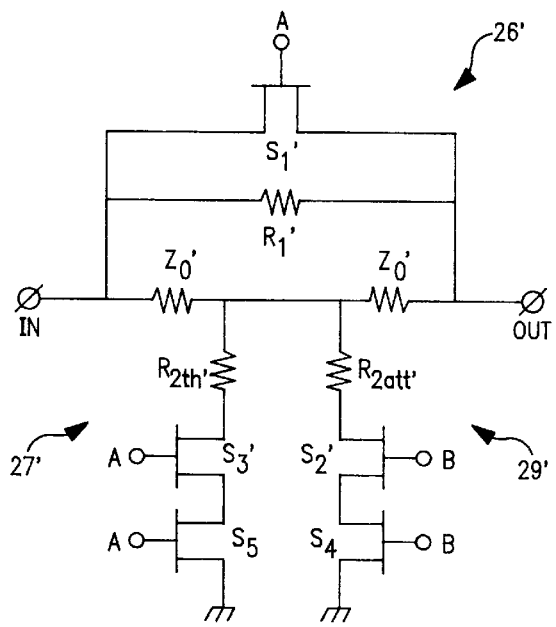
FIG. 4A is an alternate embodiment of the invention illustrated in FIG. 3A.
Figure 5A:
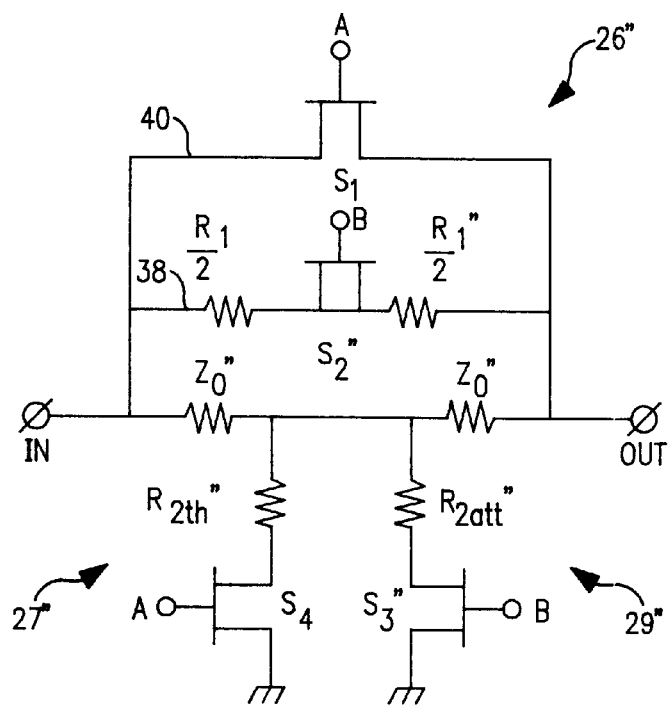
FIG. 5A is another alternate embodiment of the invention.

The present invention illustrated in FIGS. 3A, 4A and 5A, provides a bandwidth compensated switched bridged-tee attenuator in which the overall attenuation $\Delta A$ is relatively frequency independent over a relatively wide range of frequency. In all three embodiments, additional switches are utilized to force the attenuation state of the attenuator to track the frequency performance of the circuit's reference state. By forcing the attenuation state, to track the reference state, the overall or bit attenuation $\Delta A$ (the difference in dB of the two states) is relatively frequency independent over a relatively wide band of frequencies.

Referring to FIG. 3A, a first embodiment of the switched bridged-tee attenuator is illustrated and generally identified with the reference numeral 26. The switched bridged-tee attenuator includes an input terminal IN as well as an output terminal OUT. A pair of resistors, identified as $Z_0$, are connected to an input terminal IN and an output terminal OUT. The impedances $Z_0$ are selected to be equal to the system impedance in which the circuit is inserted (usually 50 $\Omega$). These resistors $Z_0$ alone do not match the attenuator to the circuit in which it is inserted. The input and output impedances of the attenuator are a function of not only the two resistors $Z_0$ but also, $R_1$, $R_2$, $R_{DS1}$ and $R_{DS2}$. This is why for a desired attenuation level, specific FET switches and matched impedance conditions, the design equations 1–5 below, yield unique solutions for the component values, $R_1$, $R_{2th}$ and $R_{2att}$.

A resistor $R_1$ is connected across the input and output terminals IN and OUT, respectively. A first switch $S_1$ is connected in parallel across the resistor $R_1$. The switch $S_1$ may be implemented as a field effect transistor (FET) with a control line A connected to its gate terminal. The switch $S_1$ is used to short out the resistor $R_1$ when the circuit is in the reference state. One end each of two resistors $R_{2th}$ and $R_{2att}$ are connected at the junction of the two resistors $Z_0$. The attenuator includes two legs 27 and 29. The leg 29 includes a second switch $S_2$, for example a FET, connected between the resistor $R_{2att}$ and ground. The switch $S_2$ is under the control of a control line B. The leg 27 includes a third switch $S_3$, which may be identical to $S_2$, connected between the resistor $R_{2th}$ and ground. The switch $S_3$ is under the control of the control line A.

Figure 3B:
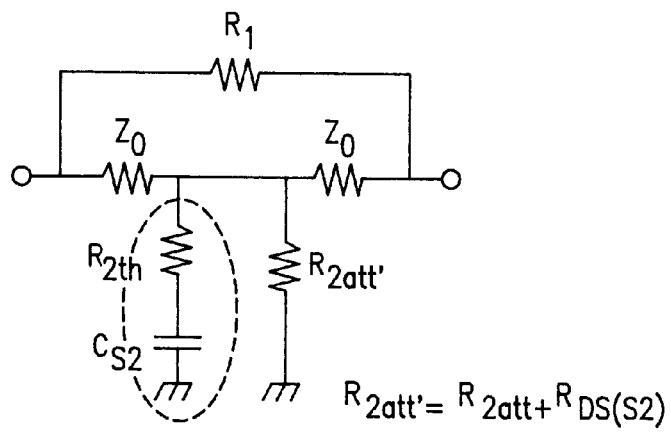
FIG. 3B is an equivalent circuit for the attenuator circuit illustrated in FIG. 3A in the attenuation state.
Figure 3C:
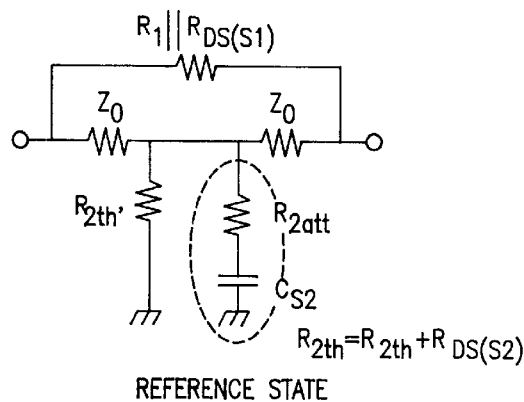
FIG. 3C is a schematic diagram of an equivalent circuit for the attenuator circuit illustrated in FIG. 3A in the reference or "thru" state.
Figure 3D:
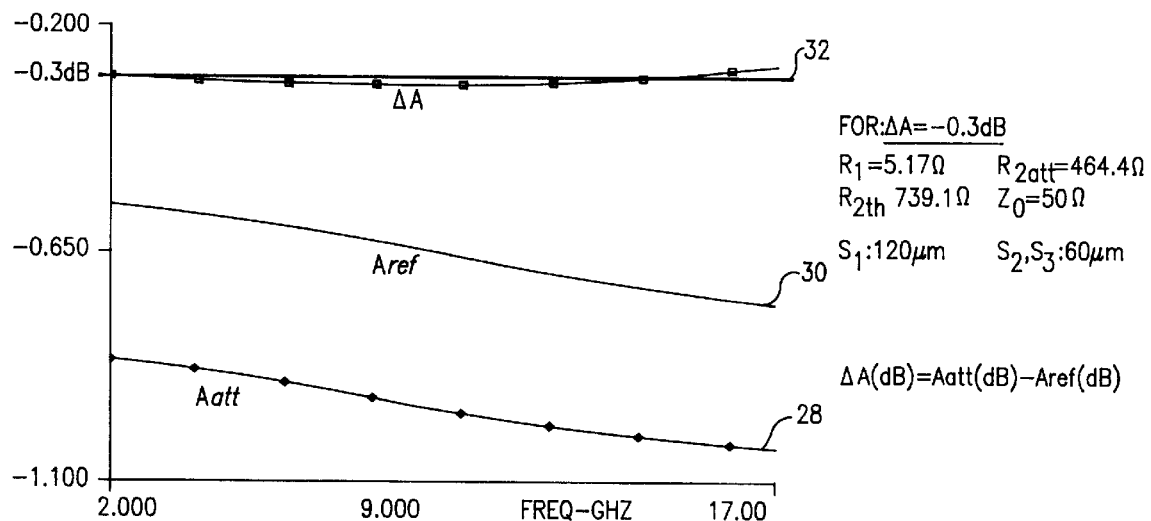
FIG. 3D is a graphical illustration of the attenuation characteristics in dB as a function of frequency for the attenuator circuit illustrated in FIG. 3A, designed for $\Delta A = -0.3$ dB of attenuation.

The logic states of the control lines A and B are illustrated in FIG. 1C. During the attenuation state, the logic state of the control line A is off or "low" while the logic state of the control line B is on or "high". An equivalent circuit of the attenuator 26 in the attenuation state is illustrated in FIG. 3B. During such a state, the resistor $R_{2att}$ is connected in series with the drain to source "on" resistance $R_{DS(S2)}$ of the switch $S_2$ since the switch $S_2$ is on. However, as illustrated in the truth table of FIG. 1C, the logic state of the control line A is off in an attenuation state. As such, the resistor $R_{2th}$ is coupled in series with the off state capacitance, $C_{S2}$, of the switch $S_3$. As such, as illustrated in FIG. 3D, the attenuation during attenuation state, as illustrated by the curve 28, is frequency dependent as shown.

In the reference state, the logic state of the control line A is on while the logic state of the control line B is off. An equivalent circuit of the attenuator 26 in the reference state is illustrated in FIG. 3C. In this state, the switch $S_1$ is on. As such, the resistor $R_1$ is in parallel with the drain to source resistance, $R_{DS(S1)}$, of the switch $S_1$. The resistor $R_{2th}$ is in series with the drain to source resistance $R_{DS(S3)}$ of the switch $S_3$ since the switch $S_3$ will also be on during this state. An important aspect of the invention is that the attenuator 26 in the reference state tracks the frequency response of the attenuation state. In particular, in the reference state, the switch $S_2$, is off. As such, the resistance $R_{2att}$ will be coupled to ground through the off state capacitance, $C_{S2}$, of the switch $S_2$, making the attenuation frequency dependent in the reference state, as illustrated by the curve 30 in FIG. 3D.

For an overall attenuation of 0.3 dB utilizing component values; $R_1=5.17\Omega$, $R_{2att}=464.4\Omega$, $R_{2th}=739.1\Omega$, $Z_0=50\Omega$, $S_1$:120 $\mu$m and $S_2$, $S_3$:60 $\mu$m HEMT devices, the attenuation as a function of frequency is illustrated in FIG. 3D. Since the overall attenuation $\Delta A$ is the difference between the attenuation in the attenuation state and the attenuation in the reference state, the curve 32 in FIG. 3D illustrates that the overall attenuation is virtually frequency independent over a relatively wide frequency range.

Figure 2A:
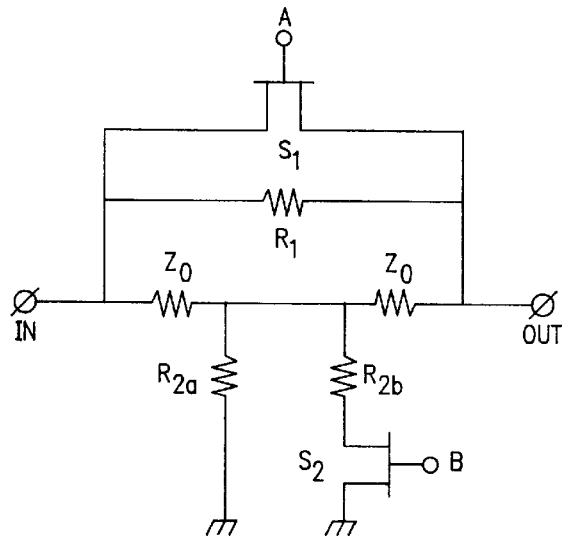
FIG. 2A is schematic diagram of a known switched bridged-tee attenuator.
Figure 2B:
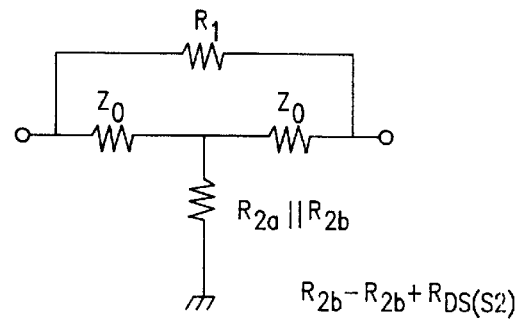
FIG. 2B is a schematic diagram of the equivalent circuit of the known switched bridged-tee attenuator circuit in the attenuation state.
Figure 2C:
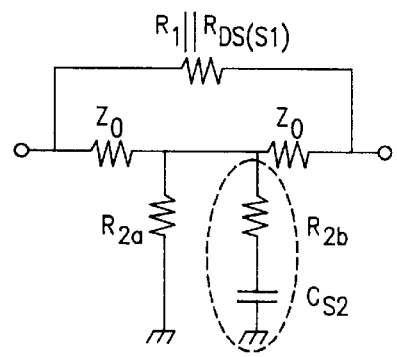
FIG. 2C is similar to FIG. 2B, but in the reference or "thru" state.
Figure 2D:
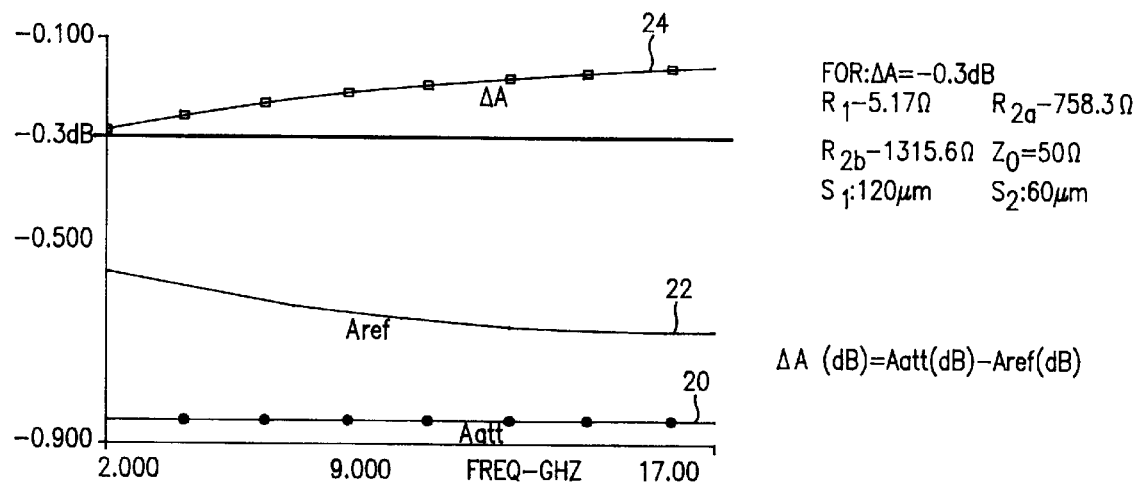
FIG. 2D is a graphical illustration of the attenuation characteristics of the circuit of FIG. 2A, (designed for $\Delta A = -0.3$ dB of attenuation), as a function of frequency for both the attenuation state and the reference state, as well as for the overall or bit attenuation, $\Delta A$.
Figure 2E:
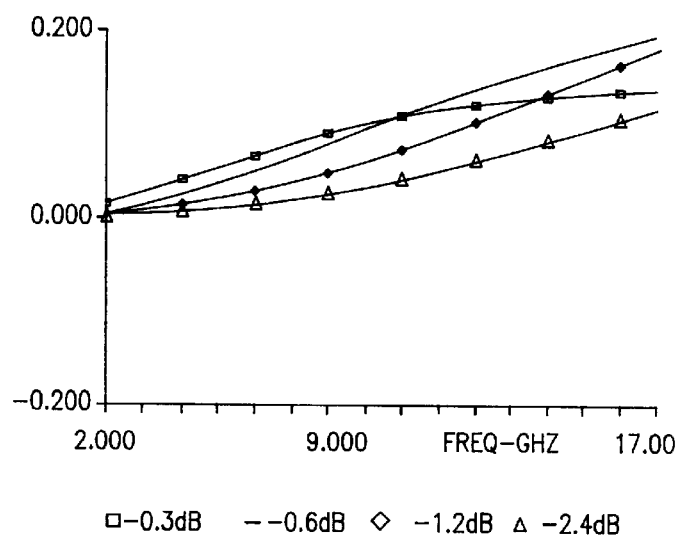
FIG. 2E is a graphical illustration of the attenuation error as a function of frequency for various attenuation levels for the known attenuator circuit illustrated in FIG. 2A.

An important aspect of the invention, is that the equivalent circuits for the attenuation and the reference states are now similar in that both have parasitic series RC networks which shunt the desired resistance to ground. Thus, for both states as frequency is increased, the overall resistance to ground decreases, tending toward the parallel combination of $R_{2att}$ and $R_{2th}$, causing the attenuation to increase for both states. Since the component values are of the same order, the attenuation behavior with frequency is nearly the same for both states. As such, the overall attenuation $\Delta A$ is essentially frequency independent as shown by the curve 32 in FIG. 3D; a significant improvement over the curve 24 of FIG. 2D which illustrates typical performance for prior art switched bridge-tee attenuation circuits.

Figure 3E:
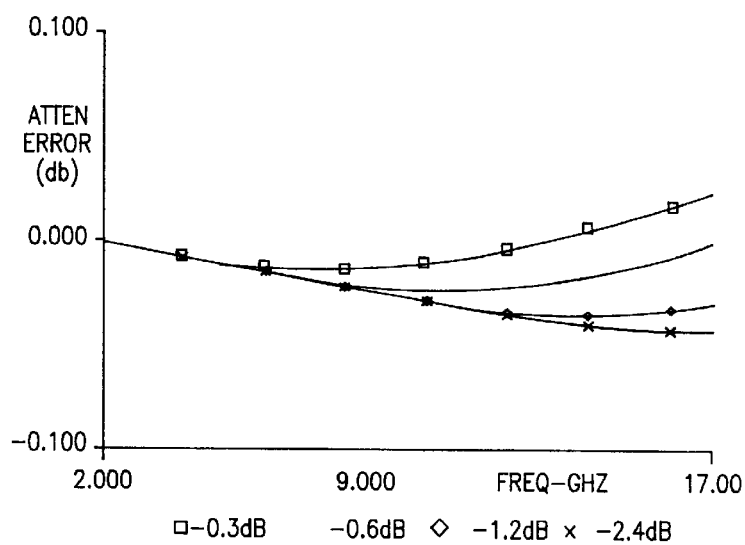
FIG. 3E is a graphical illustration of the attenuation error in dB as a function of frequency for various attenuation levels for the attenuator illustrated in FIG. 3A.

A further benefit of the improved circuit is illustrated in FIG. 3E which illustrates the attenuation error as a function of frequency for various levels of attenuation for the circuit illustrated in FIG. 3A. Referring to FIG. 3E, even though attenuation error does occur, it is very slight and is generally smaller for smaller levels of bit attenuation; unlike the prior art circuit where the error is generally larger for the smaller attenuation levels.

The switch $S_1$ is preferably selected to be a fairly large device thus yielding a small "on" resistance which ultimately sets the insertion loss of the bit. The switch $S_1$ will thus have larger "on" and "off" state capacitance than will the small switches $S_2$ and $S_3$. However, the capacitance of the switch $S_1$ shunts a relatively small resistance ($R_1$ or the parallel combination of $R_1$ and the drain to source "on" resistance of the switch $S_1$) for small attenuator bits and thus has virtually no effect on the circuit response. This is why the "off" state capacitance of $S_1$, in all examples, prior art and new, can be ignored. As $R_1$ becomes larger, for large attenuation bits, the device capacitance of $S_1$ becomes more important. However, for relatively larger attenuation levels, other architectures, such as the series-shunt $\pi$ or series-shunt tee networks may be used in lieu of the bridged-tee networks illustrated herein.

A more important concern, with the selection of $R_1$ and the switch $S_1$ is the inevitable parasitic line inductance in series with these elements. Since $R_1$ is potentially very small, these parasitic line inductances which can alter both the attenuation and the phase should be either minimized or balanced out.

The low frequency design equations for the circuit illustrated in FIG. 3A are developed by first solving for the transducer gains, $S_{21}$, under the condition of matched input and output resistances, $Z_0$, for both the reference and attenuated state equivalent circuits. Combining these equations and using the condition that $\Delta A = A_{att} - A_{ref}$ and solving for the component values in terms of $\Delta A$, $Z_0$, $R_{DS(S1)}$ and $R_{DS(S2)}$ renders unique solutions for the resistor values as shown below in equations 1 through 5.

$$R_1 = \frac{(Z_0 + R_{DS(S1)})\left(10^{\frac{-\Delta A(db)}{20}} - 1\right)}{2}\left[1 + \sqrt{1 + \frac{4R_{DS(S1)}Z_0}{(Z_0 + R_{DS(S1)})^2\left(10^{\frac{-\Delta A(db)}{20}} - 1\right)}}\right] \quad (1)$$

$$R_{2th} = \frac{Z_0^2}{\left(10^{\frac{\Delta A(db)}{20}}\right)(Z_0 + R_1) - Z_0} - R_{DS(S2)} \quad (2)$$

$$R_{2att} = \frac{Z_0^2}{R_1} - R_{DS(S2)} \quad (3)$$

where:

$$R_{DS(S1)} \triangleq R_{DSS1_{(on)}} + R_{D(S1)} + R_{S(S1)} \quad (4)$$

$$\& \quad R_{DS(S2)} \triangleq R_{DSS2_{(on)}} + R_{D(S2)} + R_{S(S2)}$$

Insertion Loss:

$$A_{ref}(dB) = 20 \log\left(\frac{R_{2th} + R_{DS(S2)}}{R_{2th} + R_{DS(S2)} + Z_0}\right) \quad (5)$$

The drain to source "on" resistances $R_{DS(S1)}$ and $R_{DS(S2)}$ of the switches $S_1$ and $S_2$, respectively ($S_3$ being essentially identical to $S_2$) are used as independent variables so that standardized FET sizes and models are easily used without the need for parameter scaling. This is important since the drain to source resistance $R_{DS(S1)}$ for the switch $S_1$ is a relatively critical parameter in any switched bridged-tee design. The drain to source resistances, $R_{DS(S1)}$ and $R_{DS(S2)}$ for the switches $S_1$ and $S_2$ respectively, represent the total drain to source "on" resistances of the switches $S_1$ and $S_2$ and include the ohmic source and drain resistance as well, ($R_S$ and $R_D$).

A second embodiment of the invention is illustrated in FIG. 4A. In this embodiment, like references with primes are used to identify like components. Two resistors $Z_0'$ are connected to the input and output terminals IN and OUT respectively. A resistor $R_1'$ is between the input terminal IN and output terminal OUT. A switch $S_1'$ is connected in parallel across the resistor $R_1'$. The switch $S_1'$ is under the control of a control line A.

The attenuator 26' includes two legs 27' and 29'. Each of the legs 27' and 29' is connected between the junction of the two resistors $Z_0$ and ground. The leg 27' includes a resistor $R_{2th}'$, connected in series to a switch $S_3$ which, in turn, is connected in series to a switch $S_5$. The source terminal of switch $S_5$, in turn, is connected to ground. Both the switch $S_3'$ and $S_5$ are under the control of the control line A.

The leg 29' includes a resistor $R_{2att}'$ and two series coupled switches $S_2'$ and $S_4$, with the source terminal of $S_4$ connected to ground. The switches $S_2'$ and $S_4$ are under the control of the control line B. The series connected switches, $S_3$ and $S_5$, as well as the combination of the $S_2'$ and $S_4$, reduce the off state capacitance essentially cutting the off state capacitance in half. Additional series connected switches further reduce the off state capacitance. As such, the circuit 26' will not only compensate for the bandwidth dissipating effect, but will also minimize the problem by reducing the off state capacitance of the switches as well. The only tradeoff is that the additional small FETs will produce a larger effective "on" state resistance. However, for smaller attenuation levels, the resistors in series with these devices, are generally much larger making this tradeoff negligible.

Figure 4B:
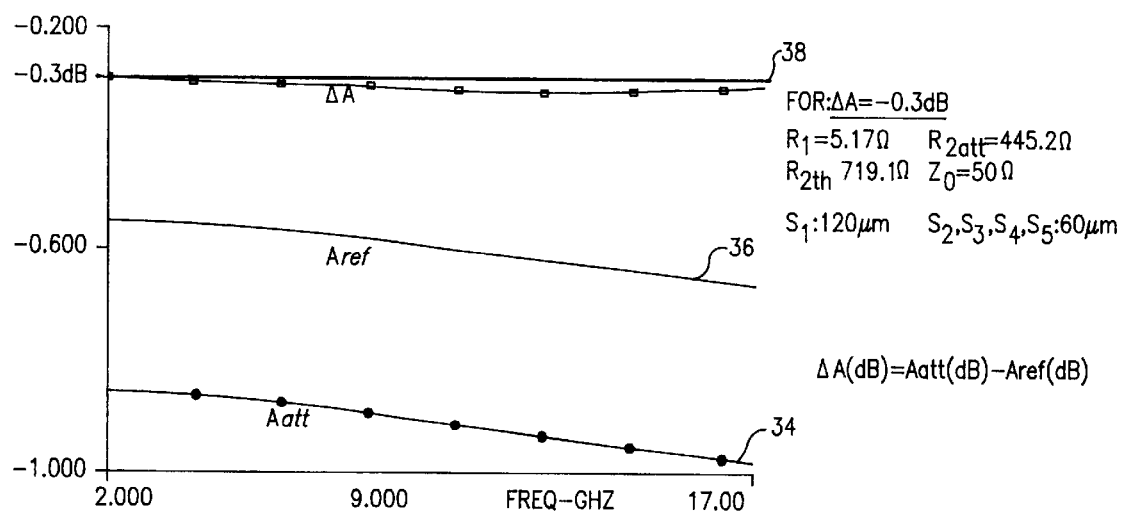
FIG. 4B is a graphical illustration of the attenuation characteristics in dB as a function of frequency for the attenuator illustrated in FIG. 4A, designed for $\Delta A = -0.3$ dB of attenuation.
Figure 4C:
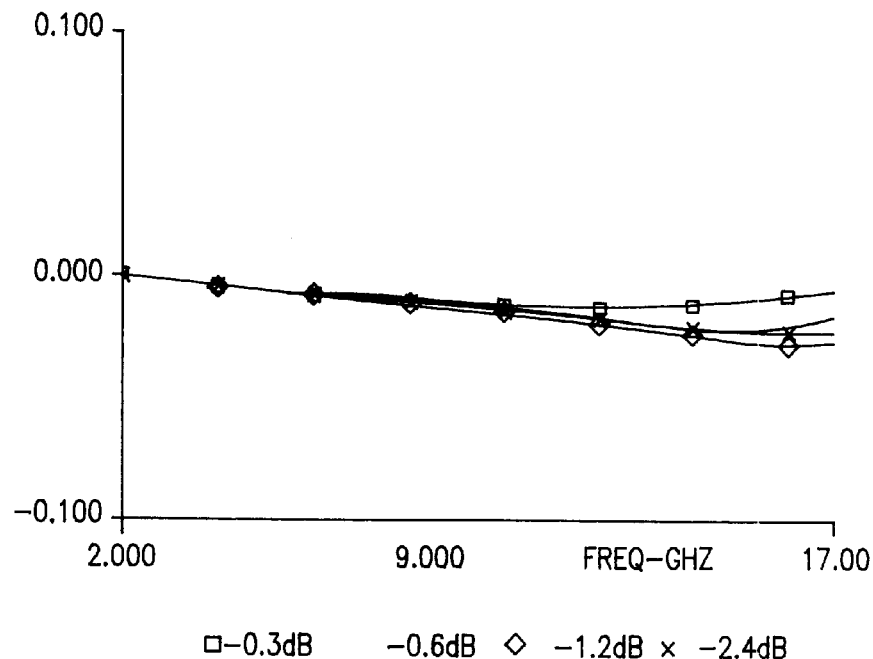
FIG. 4C is a graphical illustration of the attenuation error in dB as a function of frequency for various attenuation levels of the attenuator illustrated in FIG. 4A.

The design equations for the embodiment illustrated in FIG. 4A are the same as discussed above except that the drain source resistance $R_{DS(S2)}$ for the switch $S_2$ is doubled. For an overall attenuation of −0.3 dB with, exemplary values for the components: $R_1 \approx 5.717\Omega$; $R_{2att} \approx 455.2\Omega$; $R_{2th} \approx 719.9\Omega$, $Z_0 \approx 50\Omega$ $S_1$; 120 µm $S_2$, $S_3$, $S_4$, $S_5$; 60 µm, HEMT devices, the attenuation as a function of frequency is illustrated in FIG. 4B. As illustrated in the attenuation state, the curve 34 clearly shows that the attenuation is again frequency dependent. Similarly, the curve 36 illustrates that the attenuation in the reference state is likewise frequency dependent and tracks the attenuation in the attenuation state providing a relatively flat overall attenuation ΔA, as illustrated by the curve 38. Moreover, another improved benefit is illustrated in FIG. 4C which illustrates the attenuation error for various attenuation levels as a function of frequency. As can be seen in FIG. 4C, reducing the "off" state capacitance further reduces the attenuation error. As mentioned above, adding more switches in series further reduces the off state capacitance.

A third embodiment of the invention is illustrated in FIG. 5A. In this embodiment, an attempt to further improve the performance is made by improving on the symmetry of the two states; attenuation state and reference state. In particular, referring to FIG. 5A, the circuit identified with the reference numeral 26" includes input and output terminals IN and OUT respectively. In this embodiment, a switch $S_2$" is connected in series with the resistor $R_1$". The series combination of the switch $S_2$" and the resistor $R_1$" is connected between the input and output terminals IN and OUT respectively. A switch $S_1$" is connected in parallel with the series combination of the switch $S_2$" and the resistor $R_1$". The attenuator 26" includes two legs 27" and 29" connected between the junction of the two resistors $Z_0$" and ground. The leg 27" includes a resistor $R_{2th}$" and the switch $S_4$ which, in turn, is connected to ground. The switch $S_4$ is under the control of the control line A. The leg 29" includes a series combination of a resistor $R_{2att}$" and switch $S_3$". The switch $S_3$" is under the control of the control line B. Each of the switches $S_3$" and $S_4$ can be implemented as two or more series connected switches to reduce the off state capacitance as discussed above.

Figure 5B:
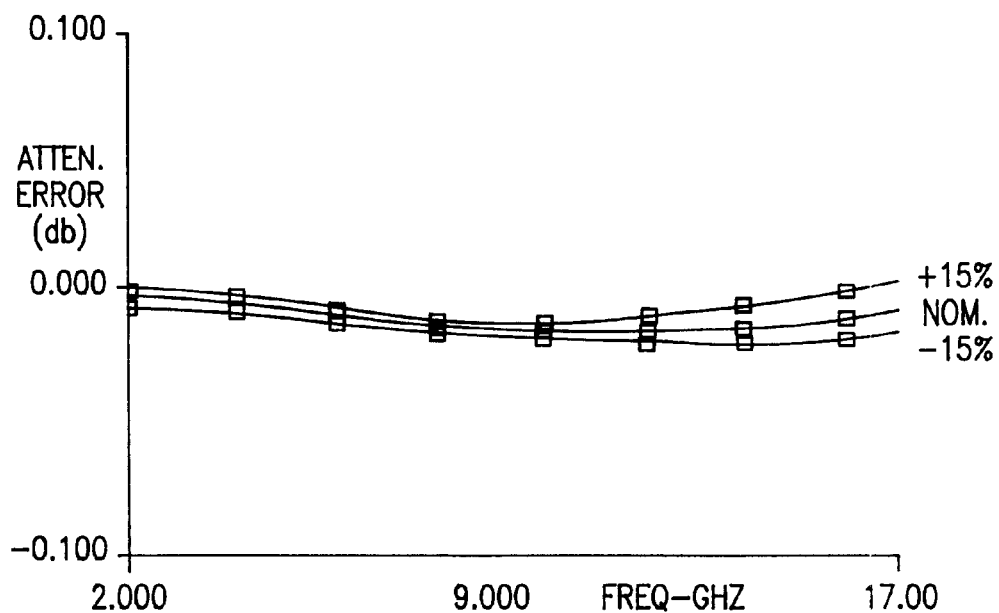
FIG. 5B is a graphical illustration of the attenuation error as a function of frequency (for $\Delta A = -0.3$ dB) illustrating the relative insensitivity of the circuit illustrated in FIG. 5A to FET +/-15% device parameter variations.
Figure 5C:
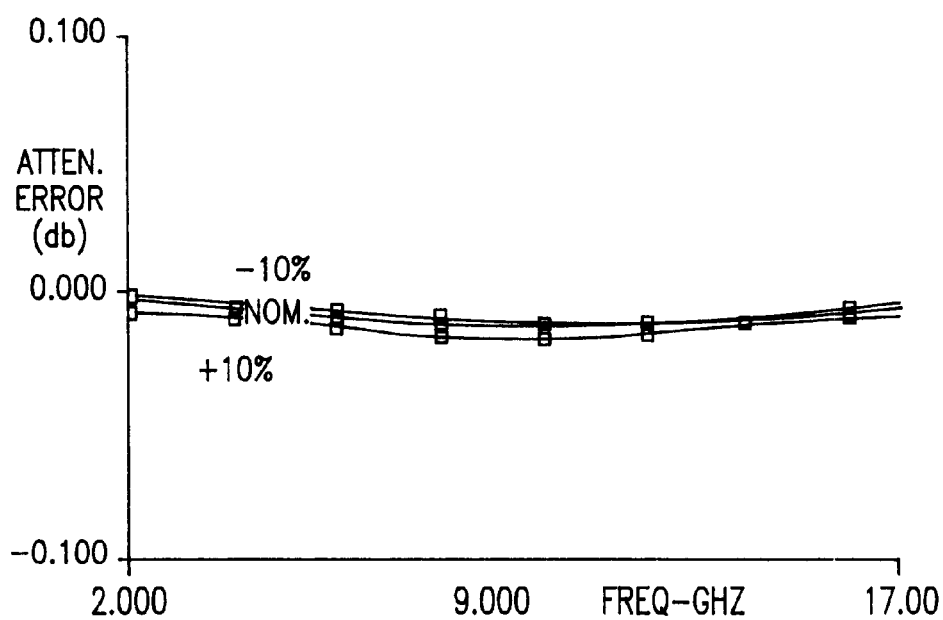
FIG. 5C is similar to FIG. 5B but illustrating the relative insensitivity of the circuit illustrated in FIG. 5A to +/-10% changes in thin film resistors.

In this embodiment, the symmetry of the shunt branches identified with the reference numeral 38 and 40 is improved. More particularly, the effects of the drain to source resistance $R_{DS(S1)}$ of the FET $S_1$, which is subject to process variations, is minimized by forcing these effects to be present in both the reference and attenuated states. The net effect is that circuit 26" exhibits relatively good insensitivity to both FET device parameter variations as well as thin film resistors variations as illustrated in FIG. 5B and 5C which give attenuation error as a function of frequency illustrating the sensitivity to a plus or minus 15% change in FET parameters in FIG. 5B and the sensitivity to a plus or minus 10% change in thin film resistors as illustrated in FIG. 5C.

The design equations for the attenuator circuit 26" are provided below.

$$R_1 = (Z_0 + R_{DS(S1)})\left(10^{\frac{-\Delta A(db)}{20}} - 1\right) \quad (6)$$

$$R_{2th} = \frac{Z_0^2}{R_{DS(S1)}} - R_{DS(S3)} \quad (7)$$

$$R_{2att} = \left(\frac{Z_0^2}{(Z_0 + R_{DS(S1)})\left(10^{\frac{-\Delta A(db)}{20}}\right) - Z_0}\right) - R_{DS(S3)} \quad (8)$$

Insertion Loss:

$$Aref(\text{dB}) = 20\log\left(\frac{R_{2th} + R_{DS(S3)}}{R_{2th} + R_{DS(S3)} + Z_0}\right) \quad (9)$$

Obviously, many modifications and variations of the present invention are possible in light of the above teachings. Thus, it is to be understood that, within the scope of the appended claims, the invention may be practiced otherwise than as specifically described above.

What is claimed and desired to be secured by letters patent of the united states is:

I claim:

1. An attenuator circuit comprising:
   an input terminal;
   an output terminal;
   a first resistor connected across said input terminal and said output terminal;
   a first switch connected in parallel with said first resistor, said first switch under the control of a first control signal;
   a first leg electrically coupled between an internal node and ground, said first leg including a second resistor and a serially coupled second switch, said second switch under the control of said first control signal;
   a second leg electrically coupled between said internal node and ground, said second leg including a third resistor and a serially coupled third switch, said third switch under the control of a second control signal;
   a fourth resistor electrically coupled between said input terminal and said internal node; and
   a fifth resistor electrically coupled between said output terminal and said internal node.

2. The attenuator circuit as recited in claim 1, wherein said first and second control signals define a first state and a second state for said attenuator circuit.

3. The attenuator circuit as recited in claim 2, wherein said first control signal is off in said first state and on in said second state.

4. The attenuator circuit as recited in claim 3, wherein said second control signal is on in said first state and off in said second state.

5. The attenuator circuit as recited in claim 1, further including a fourth switch, said fourth switch serially coupled to said second switch.

6. The attenuator circuit as recited in claim 5, wherein said fourth switch is under the control of said first control signal.

7. The attenuator circuit as recited in claim 5, further including a fifth switch, said fifth switch being serially coupled to said third switch.

8. The attenuator circuit as recited in claim 7, wherein said fifth switch is under the control of said second control signal.

9. The attenuator circuit as recited in claim 1, further including a fourth switch, said fourth switch being serially coupled to said first resistance.

10. The attenuator circuit as recited in claim 9, wherein said fourth switch is under the control of said second control signal.

11. The attenuator circuit as recited in claim 1, wherein said second switch is formed from two or more serially connected switches.

12. The attenuator circuit as recited in claim 1, wherein said third switch is formed from two or more serially connected switches.

13. An attenuator circuit comprising;

an input terminal an output terminal a first resistance connected between said input terminal and said output terminal;

a first switch connected in parallel across said first resistance, said first switch under the control of a first control signal, a first leg coupled between an internal node and ground, said first leg including a second resistance in series with a second and third switch, said second and third switches under the control of said first control signal;

a second leg coupled between said internal node and ground, said second leg including a third resistance serially coupled to a fourth and fifth switches under the control of a second control signal;

a fourth resistor electrically coupled between said internal node and said input terminal; and a fifth resistor electrically coupled between said internal node and said output terminal.

14. The attenuator circuit as recited in claim 13, wherein said first and second control signals define a first state and a second state for said attenuator circuit.

15. The attenuator circuit as recited in claim 14, wherein said first control signal is off in said first state and on in said second state and wherein said second control signal is on in said first state and off in said second state.

16. The attenuator as recited in claim 13, further including a sixth switch, said sixth switch being serially coupled to said first resistance.

17. The attenuator as recited in claim 16, wherein said sixth switch is under the control of said second control signal.

18. An attenuator circuit comprising:

an input terminal;

an output terminal;

a first resistor connected across said input terminal and said output terminal;

a first switch connected in parallel with said first resistor, said first switch under the control of a first control signal;

a first leg electrically coupled between an internal node and ground, said first leg including a second resistor and a serially coupled second switch, said second switch under the control of said first control signal;

a second leg electrically coupled between said internal node and ground, said second leg including a third resistor and a serially coupled third switch, said third switch under the control of a second control signal;

a fourth resistor electrically coupled between said internal node and said input terminal; and a fifth resistor electrically coupled between said internal node and said output terminal; and a fourth switch serially coupled to said first resistance, said fourth switch under the control of said second control signal.

19. The attenuator circuit as recited in claim 18, wherein said first and second control signals define a first state and a second state for said attenuator circuit.

20. The attenuator circuit as recited in claim 19 wherein said first control signal is off in said first state and on in said second state and wherein said second control signal is on in said first state and off in said second state.

* * * * *